United States Patent
Lukes et al.

(10) Patent No.: US 6,670,655 B2
(45) Date of Patent: Dec. 30, 2003

(54) SOI CMOS DEVICE WITH BODY TO GATE CONNECTION

(75) Inventors: Eric John Lukes, Stewartville, MN (US); Patrick Lee Rosno, Rochester, MN (US); James David Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 09/837,839

(22) Filed: Apr. 18, 2001

(65) Prior Publication Data

US 2002/0155671 A1 Oct. 24, 2002

(51) Int. Cl.[7] .............................................. H01L 27/148
(52) U.S. Cl. ...................................................... 257/217
(58) Field of Search ................................. 257/347, 369, 257/401, 402, 391, 392, 217, 342

(56) References Cited

U.S. PATENT DOCUMENTS 5,559,368 A    9/1996  Hu et al. ..................... 257/369
6,326,666 B1  12/2001  Bernstein et al. ........... 257/347
6,369,994 B1   4/2002  Voldman ...................... 361/56
6,459,106 B2 * 10/2002  Bryant et al. ............... 257/217

* cited by examiner

Primary Examiner—David Nelms
Assistant Examiner—Quoc Hoang
(74) Attorney, Agent, or Firm—Joan Pennington

(57) ABSTRACT

A method and apparatus are provided for implementing a body contact in a silicon-on-insulator field effect transistor device. A SOI field effect transistor is provided having a body contact having a predefined resistance that provides a higher device threshold voltage in the SOI FET device. A body of the SOI field effect transistor is connected to the gate of the SOI field effect transistor. The body gate connection of the SOI field effect transistor effectively lowers the device threshold voltage due to body bias effect. The SOI field effect transistor with a body connected to the gate of the SOI field effect transistor is used in circuits having stacked devices and DC currents. The SOI field effect transistor with a body connected to the gate of the SOI field effect transistor also is used in analog circuits with device matching requirements and in circuits having a low voltage power supply.

12 Claims, 5 Drawing Sheets

SOI CMOS DEVICE WITH BODY TO GATE CONNECTION

FIELD OF THE INVENTION

The present invention relates generally to the data processing field, and more particularly, relates to a silicon-on-insulator (SOI) complementary metal oxide semiconductor (CMOS) field effect transistor (FET) devices with a body of the SOI FET device connected to the gate of the SOI FET device.

DESCRIPTION OF THE RELATED ART

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power. Silicon-on-insulator (SOI) technology is also being utilized analog circuits.

Maintaining acceptable body contact resistance in SOI FET devices results in a process that raises the device threshold voltage (Vth) in the SOI FET devices. The raised device threshold voltage Vth causes supply voltage headroom problems.

As SOI technology progresses, the body contact resistance for low and normal Vth devices is increasing to the point that it is not useable because of the 1 Giga-ohm or greater resistance due to the thinning depth and lower dopant concentration of the channel of the SOI FET device. The body contact resistance can be lowered to an acceptable level for higher Vth devices. However, theses devices are difficult to use because the higher Vth causes headroom problems in analog circuits with stacked devices and DC currents. Body contacts are necessary in analog circuits due to matching requirements.

A need exists for a mechanism to maintain acceptable body contact resistance in SOI FET devices without unacceptably raising the device threshold voltage Vth in the SOI FET devices.

SUMMARY OF THE INVENTION

A principal object of the present invention is to provide silicon-on-insulator (SOI) complementary metal oxide semiconductor (CMOS) field effect transistor (FET) devices with a body contact without unacceptably raising the effective device threshold voltage Vth in the SOI FET devices. Other important objects of the present invention are to provide such SOI FET devices substantially without negative effect and that overcome many of the disadvantages of prior art arrangements.

In brief, a method and apparatus are provided for implementing a body contact in a silicon-on-insulator field effect transistor device. A SOI field effect transistor is provided having a body contact having a predefined resistance that provides a higher device threshold voltage in the SOI FET device. A body of the SOI field effect transistor is connected to the gate of the SOI field effect transistor. The body gate connection of the SOI field effect transistor effectively lowers the device threshold voltage due to body bias effect.

In accordance with features of the invention, the SOI field effect transistor with a body connected to the gate of the SOI field effect transistor is used in circuits having stacked devices and DC currents. The SOI field effect transistor with a body connected to the gate of the SOI field effect transistor also is used in analog circuits with device matching requirements and in circuits having a low voltage power supply.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
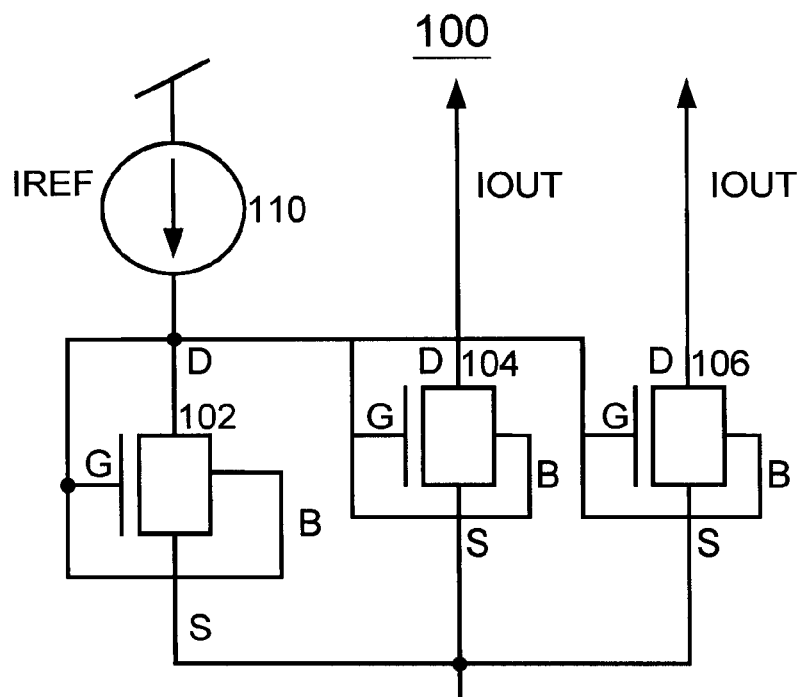
FIG. 1A is a schematic diagram representation illustrating a current mirror circuit using a silicon-on-insulator (SOI) complementary metal oxide semiconductor (CMOS) N-channel field effect transistor (NFET) device in accordance with the preferred embodiment.

Having reference now to the drawings, in FIG. 1A, there is shown a current mirror circuit generally designated by the reference character 100 in accordance with the preferred embodiment. Current mirror circuit 100 includes a plurality of silicon-on-insulator (SOI) complementary metal oxide semiconductor (CMOS) N-channel field effect transistor (NFET) or NMOS devices 102, 104, and 106 in accordance with the preferred embodiment. Each of the NFET devices 102, 104, and 106 includes a body or body contact labeled B, a gate labeled G, a source labeled S and a drain labeled D. A current reference IREF 110 is connected to the drain of NFET devices 102 and to the gate of the NFET devices 102, 104, and 106. The source of the NFET devices 102, 104, and 106 are connected together in the current mirror circuit 100. Current outputs IOUT are provided by the drains of NFET devices 104 and 106.

In accordance with features of the preferred embodiment, the body contact resistance has a predefined resistance that provides a higher voltage threshold device and the body or body contact B of the SOI FET device is connected to the gate of the SOI FET device. For example, as shown in FIG. 1A each of NFET devices 102, 104, and 106 includes a body or body contact B respectively connected to a gate of the SOI FET device in the current mirror circuit 100. This forward biases the body of the SOI FET device and lowers the threshold voltage Vth due to the body effect. A lower gate-to-source voltage Vgs is provided for a given current, allowing more power supply headroom.

Figure 1B:
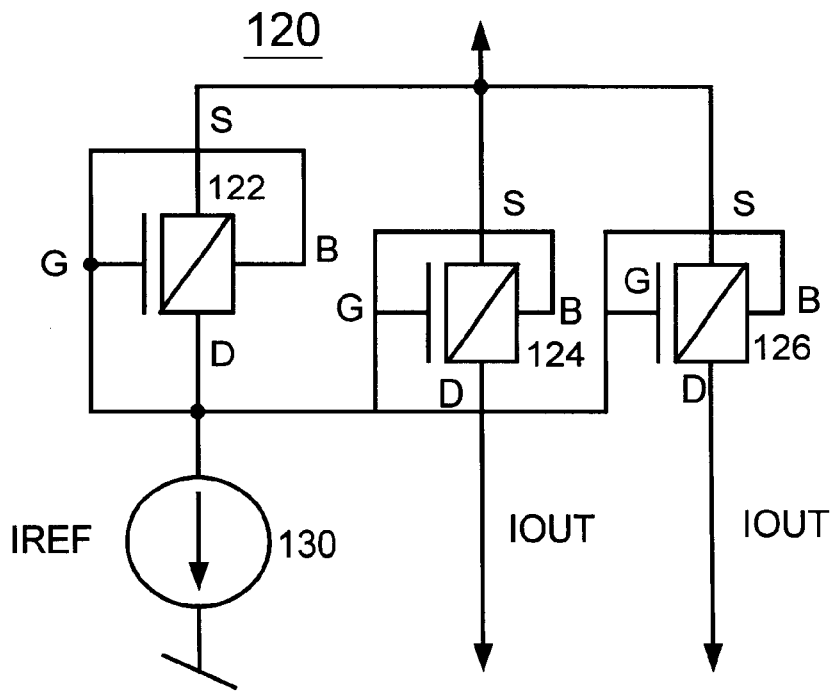
FIG. 1B is a schematic diagram representation illustrating a current mirror circuit using a silicon-on-insulator (SOI) complementary metal oxide semiconductor (CMOS) P-channel field effect transistor (PFET) device in accordance with the preferred embodiment.

Referring also to FIG. 1B, there is shown a current mirror circuit generally designated by the reference character 120 in accordance with the preferred embodiment. Current mirror circuit 120 includes a plurality of silicon-on-insulator (SOI) complementary metal oxide semiconductor (CMOS) P-channel field effect transistor (PFET) or PMOS devices 122, 124, and 126 in accordance with the preferred embodiment. Each of the PFET devices 122, 124, and 126 includes a body or body contact labeled B, a gate labeled G, a source labeled S and a drain labeled D. A current reference IREF 130 is connected to the drain of PFET devices 122 and to the gate of the PFET devices 122, 124, and 126. The source of the PFET devices 122, 124, and 126 are connected together in the current mirror circuit 120. Current outputs IOUT are provided by the drains of PFET devices 124 and 126. In current mirror 120, each of PFET devices 122, 124, and 126 includes a body or body contact B connected to a gate of the SOI FET device. This forward biases the body of the SOI FET device and lowers the threshold voltage Vth due to the body effect. The lower threshold voltage is provided for a given current, allowing more power supply headroom.

Figure 2A:
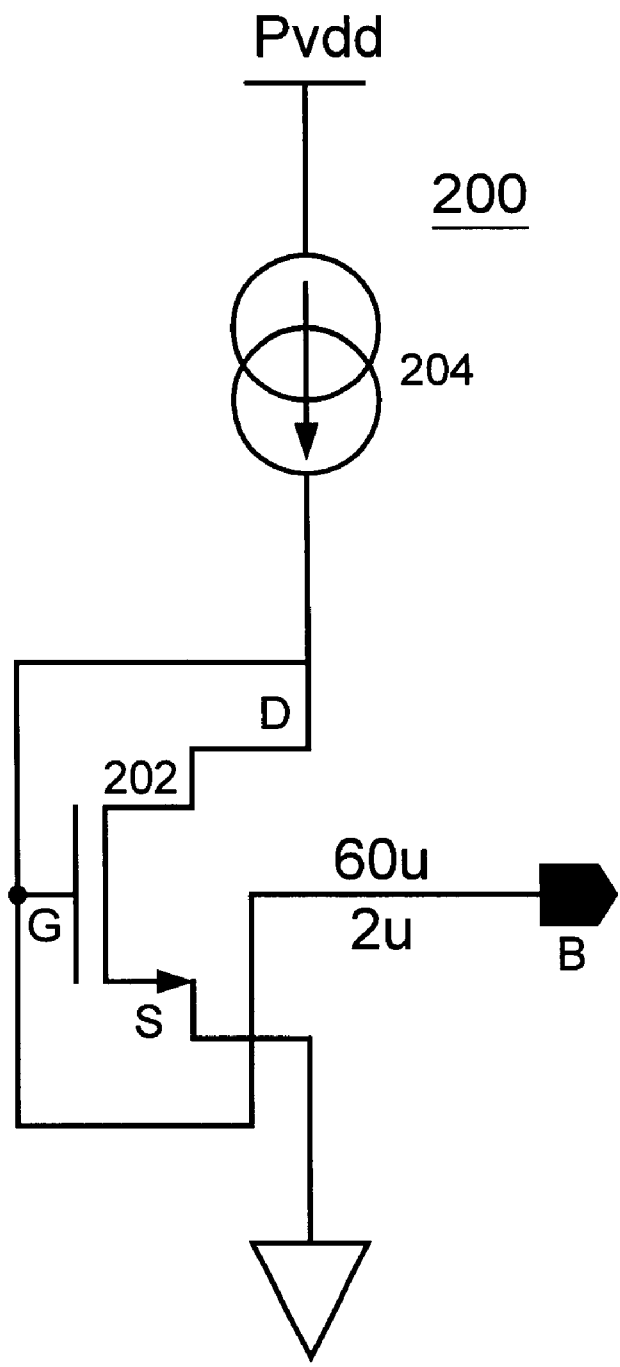
FIGS. 2A and 2B are schematic diagram representations respectively illustrating a silicon-on-insulator (SOI) complementary metal oxide semiconductor (CMOS) N-channel field effect transistor (NFET) device with a body contact in accordance with the preferred embodiment.

Referring now to FIG. 2A, there is shown a circuit generally designated by the reference character 200 in accordance with the preferred embodiment. Circuit 200 includes a silicon-on-insulator (SOI) complementary metal oxide semiconductor (CMOS) N-channel field effect transistor (NFET) or NMOS device 202 having a gate G and drain D connected to a current source 204. The body or body contact B connected to a gate G of the SOI FET device 202 in accordance with the preferred embodiment. The source S of the SOI FET device 202 is connected to ground. As shown, the SOI FET device 202 has a width of 60 microns (60 $\mu$) and a length of 2 microns (2$\mu$).

Figure 2B:
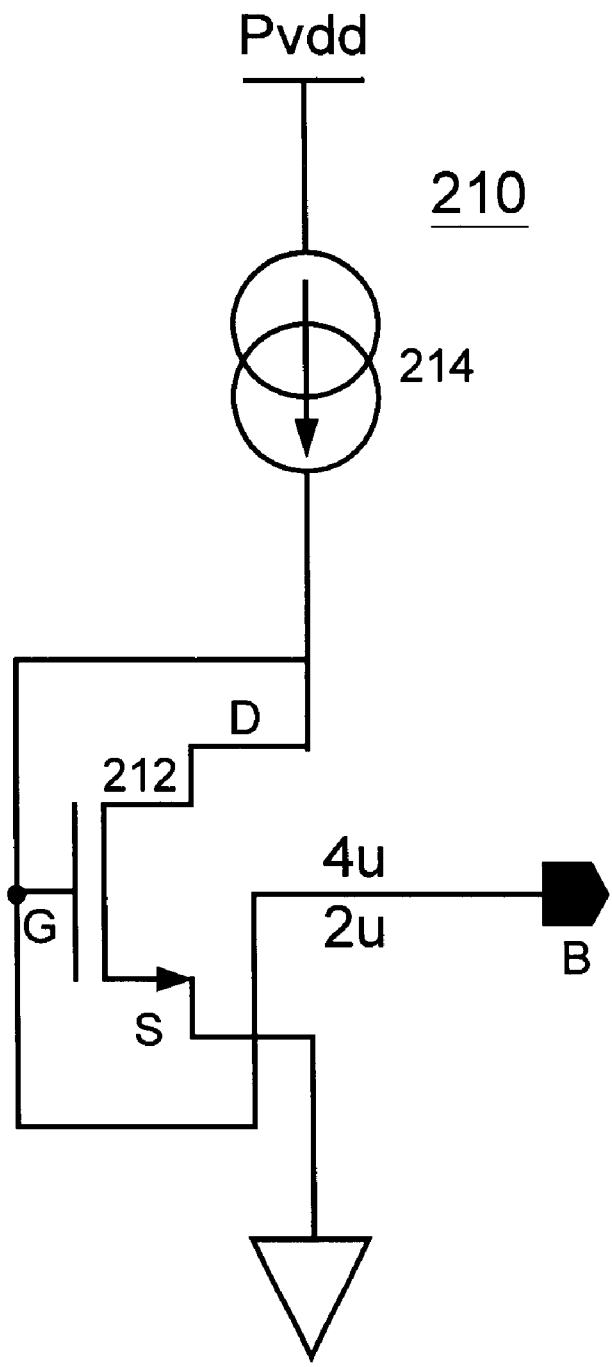

Referring also to FIG. 2B, there is shown a circuit generally designated by the reference character 210 in accordance with the preferred embodiment. Circuit 210 includes a silicon-on-insulator (SOI) complementary metal oxide semiconductor (CMOS) N-channel field effect transistor (NFET) or NMOS device 212 having a gate G and drain D connected to a current source 214. The body or body contact B connected to a gate G of the SOI FET device 212 in accordance with the preferred embodiment. The source S of the SOI FET device 212 is connected to ground. As shown, the SOI FET device 212 has a width of 4 microns (4$\mu$) and a length of 2 microns (2 $\mu$).

Figure 3:
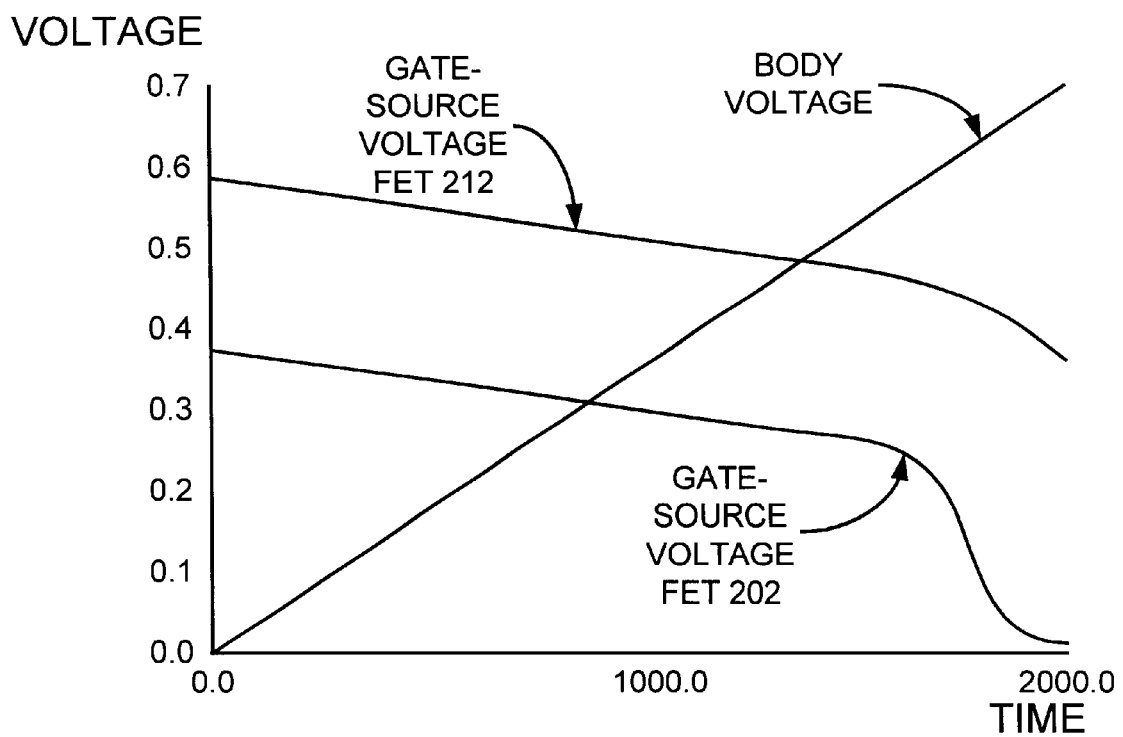
FIG. 3 is a diagram illustrating gate source voltage of the NFET devices of FIGS. 2A and 2B as a function of body voltage in accordance with the preferred embodiment.

Referring also to FIG. 3, there is shown a diagram illustrating gate-source voltage of the NFET devices 202 and 212 of FIGS. 2A and 2B as a function of body voltage in accordance with the preferred embodiment. As shown in FIG. 3, connecting the body B to the gate G of the respective SOI FET devices 202 and 212, lowers the gate-source voltage of the NFET devices 202 and 212. The gate-source voltage of the NFET device 202 is lowered from about 0.37 volts to 0.31 volts with the body B to gate G connection where the gate-source voltage and the body voltage lines intersect. The gate-source voltage of the NFET device 212 is lowered from 0.59 volts to 0.52 volts with the body B to gate G connection where the gate-source voltage and the body voltage lines intersect. For example, when the FET devices 202 and 212 are biased with approximately 30 micro-Amps current source, this provides approximately 6% additional headroom at a power supply Pvdd of 1 volt.

Figure 4:
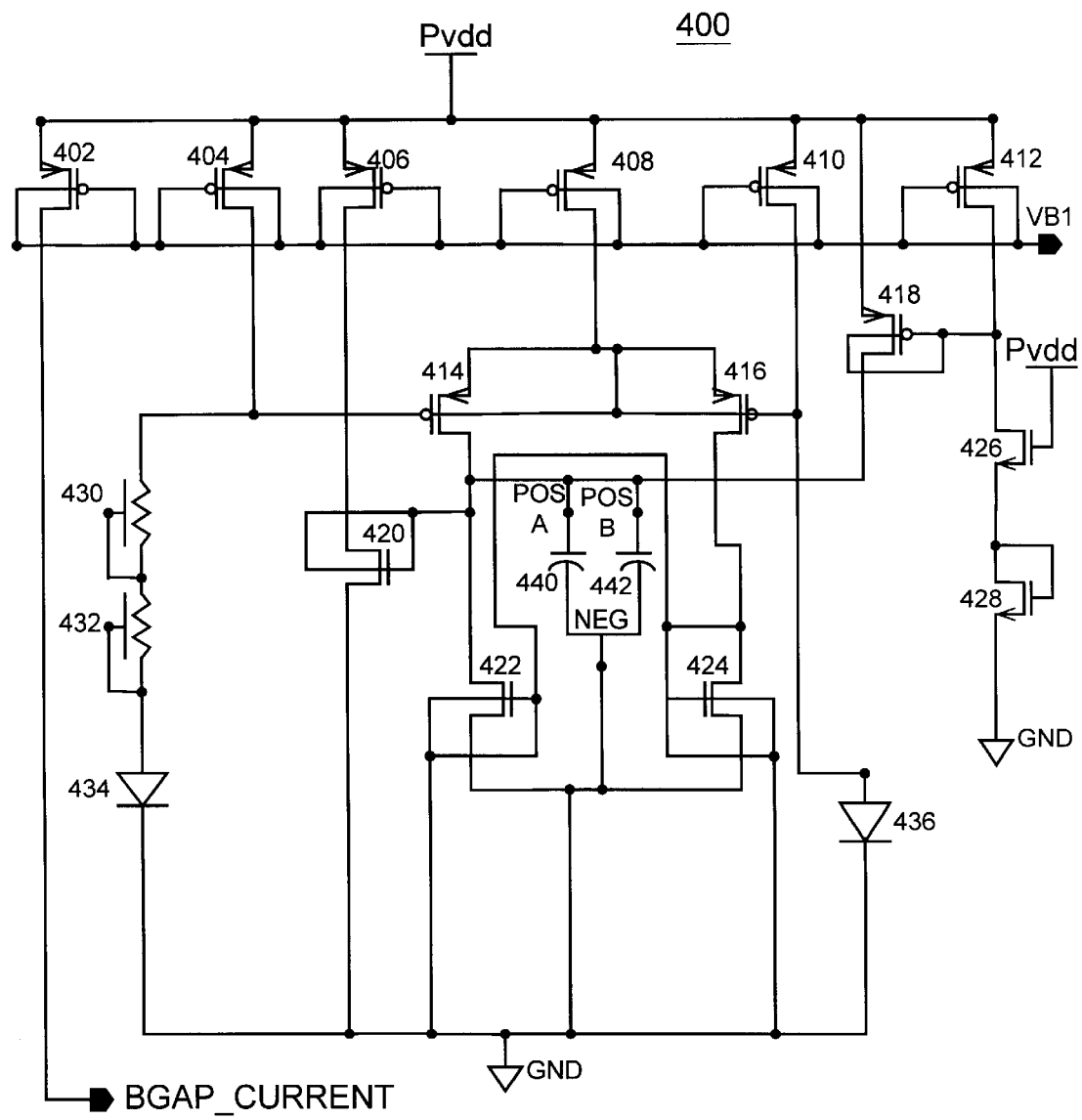
FIG. 4 is a schematic diagram representation illustrating a bandgap current circuit using silicon-on-insulator (SOI) complementary metal oxide semiconductor (CMOS) field effect transistor (FET) devices in accordance with the preferred embodiment.

Referring now to FIG. 4, there is shown a bandgap current circuit generally designated by the reference character 400 in accordance with the preferred embodiment. Bandgap circuit 400 includes a plurality of silicon-on-insulator (SOI) complementary metal oxide semiconductor (CMOS) P-channel field effect transistor (PFET) or PMOS devices 402, 404, 406, 408, 410, 412. PFETs 402, 404, 406, 408, 410 and 412 are connected between a power supply Pvdd and a node VB1. Each of the PFETs 402, 404, 406, 408, 410 and 412 includes a body or body contact connected to a gate of the SOI FET device. Bandgap circuit 400 includes a plurality of SOI PFETs 414, 416 and 418 and a plurality of NFETS 420, 422, 424, each having a body or body contact connected to a gate of the SOI FET device. PFET 408 is series connected to SOI PFETs 414 and 416. SOI PFETs 414 and 416 are respectively series connected to a respective NFET 422, 424. NFET 420 is connected between the PFET 406 and ground. Bandgap circuit 400 includes a pair of NFETs 426 and 428 connected between PFET 412 and ground. A gate of NFET 426 is connected to the power supply Pvdd and a gate of NFET 428 is connected to the connection of PFET 412 and NFET 428. A body gate connection is not provided for the NFETs 426 and 428. Bandgap circuit 400 includes a pair of series-connected variable resistors 430 and 432 connected between the PFET 404 and a diode 434 connected to ground. A diode 436 is connected between the connection of PFET 410 and gate of PFET 416 and ground. Bandgap circuit 400 includes a pair of capacitors 440 and 442 connected between the connection PFETs 414 and 418 and NFETs 422 and 424. PFET 402 provides a BGAP_CURRENT output. In the bandgap circuit 400, each of the PFETs 402, 404, 406, 408, 410, 412, 414, 416 and 418 and NFETS 420, 422, 424 has a lower threshold voltage resulting from each respective body to gate connection, avoiding voltage supply headroom problems.

It should be understood that the connection of the body or body contact B of the SOI FET device to the gate of the SOI FET device is not limited to analog circuits. For example, this technique is also useful in logic circuits when the power supply voltage drops below the junction forward bias voltage.

It should be understood that the present invention is not limited to SOI FET devices and is also applicable to bulk FET devices. For example, with an N-channel FET, the P-well replaces the SOI body connection for each device. Also, for example, with a P-channel FET, the N-well replaces the SOI body connection for each device. With the bulk FET devices, the P-well or N-well is connected to the FET gate for each FET device. This lowers the threshold voltage Vth and a lower threshold voltage is provided for a given current, allowing more power supply headroom.

While the present invention has been described with reference to the details of the embodiments of the invention shown in the drawing, these details are not intended to limit the scope of the invention as claimed in the appended claims.

What is claimed is:

1. Apparatus for implementing a body contact in a silicon-on-insulator field effect transistor device comprising:

said silicon-on-insulator (SOI) field effect transistor device having said body contact with a predefined resistance providing a higher voltage threshold device;

said body contact of said SOI field effect transistor device connected to said gate of said SOI field effect transistor device, said body contact being forward biased and said connected body contact and gate effectively lowering said device threshold voltage in said SOI field effect transistor device.

2. Apparatus for implementing said body contact in said silicon-on-insulator field effect transistor device as recited in claim 1 wherein said SOI field effect transistor device includes an N-channel field effect transistor.

3. Apparatus for implementing said body contact in said silicon-on-insulator field effect transistor device as recited in claim 2 wherein said body contact being forward biased above a source voltage of said N-channel field effect transistor.

4. Apparatus for implementing said body contact in a silicon-on-insulator field effect transistor device as recited in claim 1 wherein said SOI field effect transistor device includes a P-channel field effect transistor.

5. Apparatus for implementing said body contact in said silicon-on-insulator field effect transistor device as recited in claim 4 wherein said body contact being biased below a source voltage of said P-channel field effect transistor.

6. Apparatus for implementing said body contact in said silicon-on-insulator field effect transistor device as recited in claim 1 includes a current mirror circuit formed of a plurality of said SOI field effect transistor devices, a source of each of said plurality of said SOI field effect transistor devices connected together; and a current reference connected to a gate of each of said plurality of said SOI field effect transistor devices, and said current reference connected to a drain of one of said plurality of said SOI field effect transistor devices; and current outputs provided by a drain of others of said plurality of said SOI field effect transistor devices.

7. Apparatus for implementing said body contact in said silicon-on-insulator field effect transistor device as recited in claim 6 wherein each of said plurality of said SOI field effect transistor device includes an N-channel field effect transistor.

8. Apparatus for implementing said body contact in said silicon-on-insulator field effect transistor device as recited in claim 6 wherein each of said plurality of said SOI field effect transistor device includes a P-channel field effect transistor.

9. Apparatus for implementing said body contact in said silicon-on-insulator field effect transistor device as recited in claim 1 includes a bandgap current circuit formed of a plurality of said SOI field effect transistor devices including P-channel field effect transistors and N-channel field effect transistors.

10. Apparatus for implementing said body contact in said silicon-on-insulator field effect transistor device as recited in claim 1 wherein said SOI field effect transistor includes a current source coupled to a drain and a gate of said SOI field effect transistor device.

11. Apparatus for implementing said body contact in said silicon-on-insulator field effect transistor device as recited in claim 1 includes a stack of a plurality of said SOI field effect transistor devices connected between a power supply and ground.

12. Apparatus for implementing said body contact in said silicon-on-insulator field effect transistor device as recited in claim 11 wherein said power supply includes a low voltage power supply.

* * * * *